(12) United States Patent
Zafiropoulo (10) Patent No.: US 8,501,638 B1
(45) Date of Patent: Aug. 6, 2013

(54) LASER ANNEALING SCANNING METHODS WITH REDUCED ANNEALING NON-UNIFORMITIES

(75) Inventor: Arthur W. Zafiropoulo, Atherton, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 13/459,031

(22) Filed: Apr. 27, 2012

(51) Int. Cl.
*H01L 21/00* (2006.01)

(52) U.S. Cl.
USPC ............ 438/799; 438/33; 257/E21.328

(58) Field of Classification Search
USPC ............... 438/799, 33, 487; 257/E21.328; 219/121.67; 250/492.22
See application file for complete search history.

(56) References Cited

U.S. PATENT DOCUMENTS

| | | | |
|---|---|---|---|
| 4,234,356 A | 11/1980 | Auston et al. | |
| 4,375,993 A | 3/1983 | Mori et al. | |
| 5,401,666 A | 3/1995 | Tsukamoto | |
| 5,612,251 A | 3/1997 | Lee | |
| 5,767,003 A | 6/1998 | Noguchi | |
| 5,803,965 A | 9/1998 | Yoon | |
| 5,908,307 A | 6/1999 | Talwar et al. | |
| 5,930,617 A | 7/1999 | Wu | |
| 5,959,779 A | 9/1999 | Yamazaki et al. | |
| 6,066,516 A | 5/2000 | Miyasaka | |
| 6,281,057 B2 | 8/2001 | Aya et al. | |
| 6,303,476 B1 | 10/2001 | Hawryluk et al. | |
| 6,335,509 B1 | 1/2002 | Jung | |
| 6,365,476 B1 | 4/2002 | Talwar et al. | |
| 6,366,308 B1 | 4/2002 | Hawryluk et al. | |
| 6,368,947 B1 | 4/2002 | Yu | |
| 6,383,956 B2 | 5/2002 | Hawryluk et al. | |
| 6,479,821 B1 | 11/2002 | Hawryluk et al. | |
| 6,514,339 B1 | 2/2003 | Jung | |
| 6,521,501 B1 | 2/2003 | Erhardt et al. | |
| 6,524,977 B1 | 2/2003 | Yamazaki et al. | |
| 6,531,681 B1 | 3/2003 | Markle et al. | |
| 6,548,361 B1 | 4/2003 | En et al. | |
| 6,558,991 B2 | 5/2003 | Yamazaki et al. | |
| 6,632,749 B2 | 10/2003 | Miyasaka et al. | |
| 6,693,257 B1 | 2/2004 | Tanaka | |
| 6,730,550 B1 | 5/2004 | Yamazaki et al. | |
| 6,747,245 B2 | 6/2004 | Talwar et al. | |
| 6,974,731 B2 | 12/2005 | Yamazaki et al. | |
| 6,987,240 B2 | 1/2006 | Jennings et al. | |
| 7,005,601 B2 | 2/2006 | Jennings | |
| 7,098,155 B2 | 8/2006 | Talwar et al. | |
| 7,279,721 B2 | 10/2007 | Jennings et al. | |
| 7,482,254 B2 | 1/2009 | Bakeman | |
| 7,494,942 B2 | 2/2009 | Talwar et al. | |
| 7,595,208 B2 | 9/2009 | Jennings et al. | |
| 7,932,139 B2 | 4/2011 | Bu et al. | |
| 8,014,427 B1 | 9/2011 | Anikitchev | |
| 8,026,519 B1 | 9/2011 | Anikitchev et al. | |
| 2002/0048864 A1 | 4/2002 | Yamazaki et al. | |

(Continued)

*Primary Examiner* — Caridad Everhart
(74) *Attorney, Agent, or Firm* — Opticus IP Law PLLC (57) ABSTRACT

Laser annealing scanning methods that result in reduced annealing non-uniformities in semiconductor device structures under fabrication are disclosed. The methods include defining a length of an annealing laser beam such that the tails of the laser beam resided only within scribe lines that separate the semiconductor device structures. The annealing laser beam tails from adjacent scan path segments can overlap or not overlap within the scribe lines. The cross-scan length of the annealing laser beam can be selected to simultaneously scan more than one semiconductor device structure, as long as annealing laser beam is configured such that the tails do not fall within a semiconductor device structure.

10 Claims, 8 Drawing Sheets

(56) References Cited

U.S. PATENT DOCUMENTS

| | | |
|---|---|---|
| 2004/0097103 A1 | 5/2004 | Imai et al. |
| 2004/0198028 A1 | 10/2004 | Tanaka et al. |
| 2004/0253838 A1 | 12/2004 | Yamazaki et al. |
| 2007/0158315 A1 | 7/2007 | Tanaka et al. |
| 2009/0034071 A1* | 2/2009 | Jennings et al. .............. 359/494 |
| 2009/0311880 A1 | 12/2009 | Jennings et al. |
| 2010/0065547 A1* | 3/2010 | Moffatt et al. ................ 219/475 |
| 2011/0263069 A1 | 10/2011 | Hsu et al. |

* cited by examiner

LASER ANNEALING SCANNING METHODS WITH REDUCED ANNEALING NON-UNIFORMITIES

FIELD

The present disclosure relates generally to annealing as used in semiconductor manufacturing to fabricate semiconductor devices, and in particular relates to laser annealing that utilizes a scanning annealing laser beam in a manner that reduces annealing non-uniformities.

BACKGROUND ART

Laser annealing using a scanned annealing laser beam offers an ultra-low thermal budget, a high dopant activation and super-abrupt junctions that are ideal for advanced semiconductor device fabrication. Consequently, most logic devices with minimum feature sizes below 45 nm, and many memory devices below 32 nm, now use some form of laser processing for one of several manufacturing steps, including source-drain activation, metal-silicon alloy formation, defect annealing, and the like.

In all of these semiconductor fabrication applications, the width of the scanned annealing laser beam is significantly smaller than the width of the semiconductor wafer that supports the semiconductor device structures as they are being fabricated. As a result, it becomes necessary to scan and "stitch" the beam over the wafer when annealing the semiconductor device structures.

Unfortunately, the semiconductor device structures under fabrication that lie in the stitch overlap region may not be annealed in exactly the same way as those devices in the middle of the beam. This is because the devices in the overlap region see the tails of the annealing beam and may not be annealed to the same temperature as the region in the center of the annealing beam.

In addition, the semiconductor device structures in the overlap regions see the tail beam twice from adjacent scans of the annealing beam. As a result, there can be degradation in the uniformity of the annealing of the semiconductor device structures across the wafer.

SUMMARY

An aspect of the disclosure is a method of annealing semiconductor device structures supported by a semiconductor wafer. The method includes providing the semiconductor wafer having a wafer surface, with the semiconductor device structures having a cross-scan width WD and spaced apart by scribe lines having a cross-scan width WS. The method also includes defining a length L of an annealing laser beam that satisfies the relationship $n \cdot WD+(n-1) \cdot WS < L < n \cdot WD+(n+1) \cdot WS$ for integer n, the annealing laser beam having a central section of substantially uniform intensity and opposite tails of substantially reduced intensity as compared to the central section. The method also includes scanning the annealing laser beam over the semiconductor device structures over a scan path having adjacent scan path segments such that the center section simultaneously passes over at least n semiconductor devices while the tails of the annealing laser beam associated with the adjacent scan path segments reside only within the scribe lines.

Another aspect of the disclosure is the method described above, wherein the length L is selected such that the tails of the annealing laser beam associated with the adjacent scan path segments overlap within the scribe lines.

Another aspect of the disclosure is the method described above, wherein the length L is selected such that the tails of the annealing laser beam associated with the adjacent scan path segments reside within the scribe lines but do not overlap within the scribe lines.

Another aspect of the disclosure is the method described above, wherein the semiconductor device structures comprise dies and the scribe lines reside between the dies.

Another aspect of the disclosure is the method described above, wherein the semiconductor device structures comprise dies that in turn include integrated circuit (IC) chips, and wherein the scribe lines reside between the IC chips and between the dies.

Another aspect of the disclosure is a method of laser annealing semiconductor device structures supported by a semiconductor wafer. The method includes providing the semiconductor wafer such that the semiconductor device structures are spaced apart by scribe lines. The method also includes defining an annealing laser beam having a central section of substantially uniform intensity and opposite tails of substantially reduced intensity as compared to the central section. The method also includes scanning a laser beam over the semiconductor wafer and the semiconductor device structures such that the central section simultaneously covers the entirety of one or more semiconductor device structures while he tails reside entirely within the scribe lines.

Another aspect of the disclosure is the method described above and further including performing the scanning over a scan path having adjacent scan path segments, and wherein the tails of the annealing laser beam associated with the adjacent scan path segments overlap within the scribe lines.

Another aspect of the disclosure is the method described above, further including performing the scanning over a scan path having adjacent scan path segments, and wherein the tails of the annealing laser beam associated with the adjacent scan path segments do not overlap within the scribe lines.

Another aspect of the disclosure is the method described above, wherein the scribe lines have a cross-scan width in the range from 50 microns to 75 microns.

Another aspect of the disclosure is the method described above, wherein the semiconductor device structures have a cross-scan width WD, the scribe lines have a cross-scan width WS, and wherein the annealing laser beam has a length L that satisfies the relationship for integer n:

$$n \cdot WD+(n-1) \cdot WS < L < n \cdot WD+(n+1) \cdot WS.$$

Additional features and advantages of the disclosure are set forth in the detailed description that follows, and in part will be readily apparent to those skilled in the art from that description or recognized by practicing the embodiments as described herein, including the detailed description which follows, the claims, as well as the appended drawings.

It is to be understood that both the foregoing general description and the following detailed description presented below are intended to provide an overview or framework for understanding the nature and character of the disclosure as it is claimed. The accompanying drawings are included to provide a further understanding of the disclosure, and are incorporated into and constitute a part of this specification. The drawings illustrate various embodiments of the disclosure, and together with the description serve to explain the principles and operations of the disclosure.

The claims set forth below constitute part of this specification and in particular are incorporated into the detailed description set forth below.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure. In some of the Figures, Cartesian coordinates are provided for the sake of reference and are not intended as providing limitations on specific directions and orientations of the systems and methods described herein.

All references cited herein are incorporated by reference herein.

In the discussion below, the term "wafer" is shorthand for "semiconductor wafer" such as used in the fabrication of integrated circuit devices. An exemplary wafer is a silicon wafer. The annealing non-uniformities that the methods of the present disclosure seek to reduce are temperature non-uniformities that arise from different parts of the wafer being subjected to different amounts (intensities) of the annealing laser beam. Different annealing temperatures can result in corresponding difference in performance of the semiconductor device structures being processed. For example, different annealing temperatures can result in different dopant activations of doped source and drain regions of transistors.

Figure 1A:
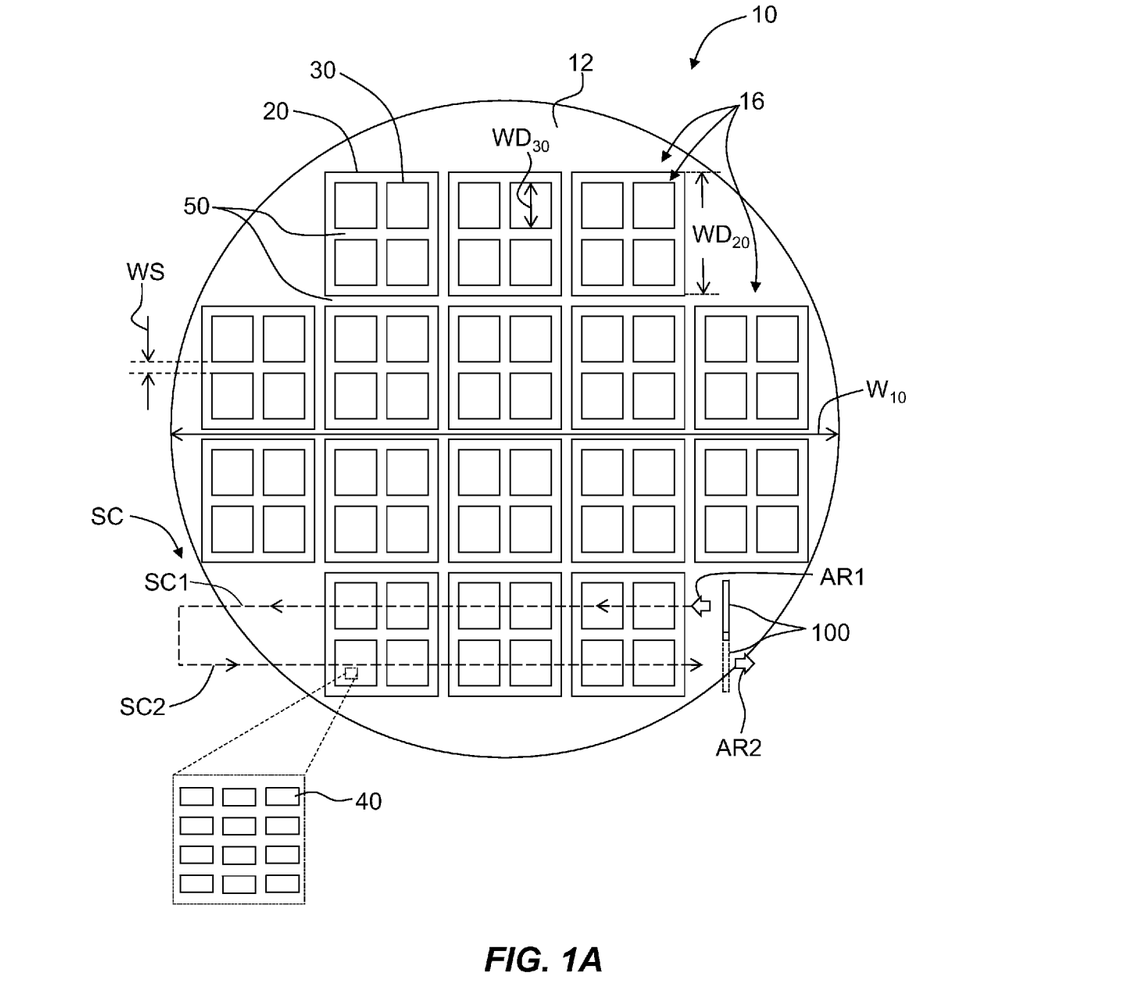
FIG. 1A is a plan view of an example wafer having an array of dies, with each die including four IC chips, with adjacent dies and adjacent IC chips separated by scribe lines, with an example annealing laser beam shown off of the wafer to illustrate adjacent scan paths.

FIG. 1A is a plan view of an example semiconductor wafer 10 that has a surface 12. Wafer 10 supports a plurality of spaced-apart semiconductor device structures ("device structures") 16 under fabrication. Devices structures 16 generally have a cross-scan width WD, i.e., as measured in a direction perpendicular to a scan direction of an annealing laser beam 100, as described below.

Example device structures 16 can include dies 20 that each include one or more integrated circuit (IC) chips 30, which in turn include one or more semiconductor devices 40, such as transistors, etc. as best seen in the inset in the lower part of FIG. 1. Here, the dies 20, IC chips 30 and semiconductor devices 40 are understood as being under fabrication on their way to becoming completed dies, IC chips and semiconductor devices, respectively. The fabrication process for these example device structures 16 includes laser annealing. Device structures 16 are described herein in connection with dies 20 and IC chips 30 by way of non-limiting example.

As mentioned above, adjacent device structures 16 are spaced apart to facilitate post-processing of wafer 10. In the example shown in FIG. 1A, the IC chips 30 within a given die 20 are spaced apart, and the dies 20 on wafer 10 are also spaced apart. The spaces between adjacent devices structures 16—namely, between IC chips 30 and between adjacent dies 20—define scribe lines 50. Scribe lines 50 have a width WS, which can vary depending on the location of the particular scribe line. For example, scribe lines 50 between adjacent IC chips 30 may be narrower than scribe lines between adjacent dies 20. Scribe lines 50 are used to singulate (dice) dies 20 (i.e., separate the dies from each other) as well as singulate IC chips 30. This singulation is typically performed by a cutting process (e.g., by precision sawing). The cross-scan width WS of a typical scribe line 50 is in the range from about 50 microns and 75 microns.

Figure 1B:
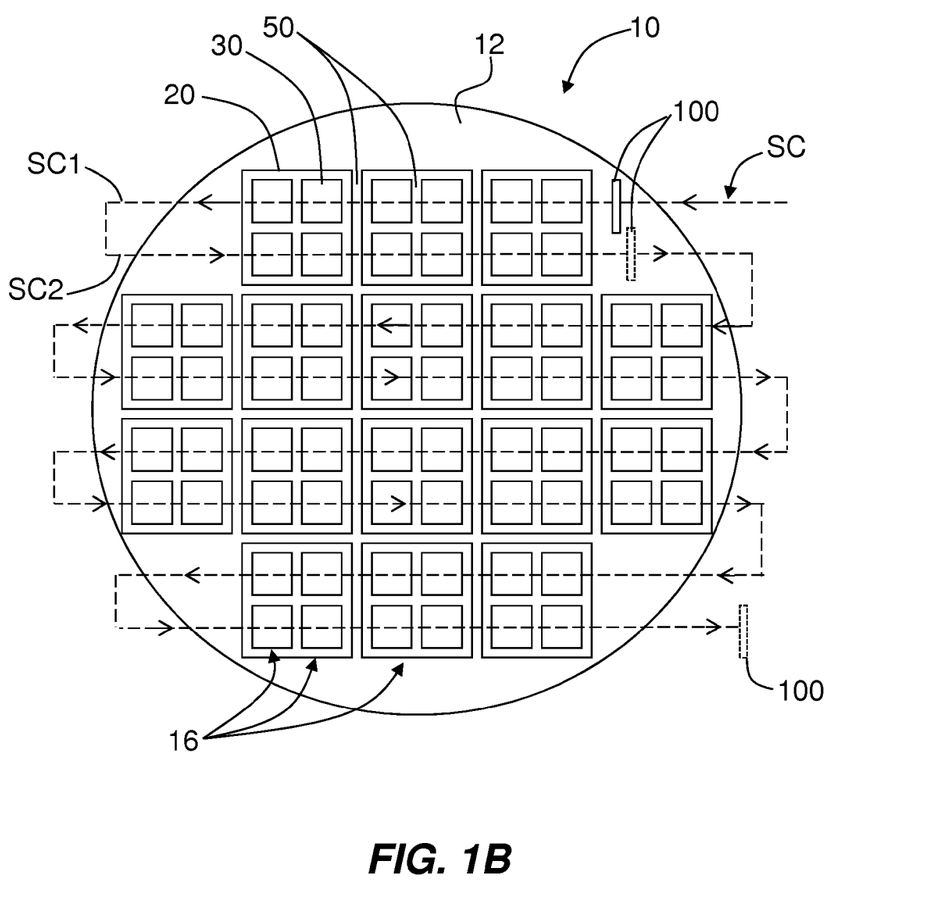
FIG. 1B is similar to FIG. 1A and illustrates an example of an entire scan path for the annealing laser beam that places the tails of the annealing laser beam within scribe lines.

FIG. 1A also shows an example annealing laser beam 100 that scans over wafer surface 12 over a scan path SC. Scan path SC is shown by way of example as having two adjacent scan path segments SC1 and SC2, with the direction of the scan of the annealing laser beam '00 being indicated by respective arrows AR1 and AR2. FIG. 1B is similar to FIG. 1A and shows an example of an entire scan path SC for annealing laser beam 100, along with example adjacent scan path segments SC1 and SC2. The annealing laser beam 100 associated with scan path segment SC1 is shown as a solid line while same annealing laser beam associated with scan path segment SC2 is shown as a dotted line for ease of illustration. In an example, wafer 10 is moved relative to annealing laser beam 100 to define scan path SC, while in another example, at least one of the wafer and annealing laser beam is moved to define scan path SC.

Example systems for performing laser annealing using annealing laser beam 100 are described in the following U.S. Pat. Nos. 6,365,476; 6,366,308; 6,531,681; 6,747,245; 7,494,942; 7,932,139; 8,014,427; and 8,026,519.

Wafer 10 has a diameter $W_{10}$ that is typically 300 mm, which is far larger than the length of a typical annealing laser beam 100. Dies 20 have a width $WD_{20}$ that is typically in the 20-35 mm range, while IC chips 30 have a width $WD_{30}$ that is typically in the 5-35 mm range.

For optimum performance of the IC chips 30, it is desirable to have all the semiconductor devices 40 (junctions, transistors, etc.,) within each IC chip 30 to perform similarly. Likewise, it is preferable that all IC chips 30 within a given die 20, and for IC chips 30 from different dies 20 to perform similarly. To this end, an aspect of the disclosure involves performing the stitching of the annealing laser beam 100 not within the IC chips 30 or within the dies 20 but rather within the scribe lines 50.

Figure 2A:
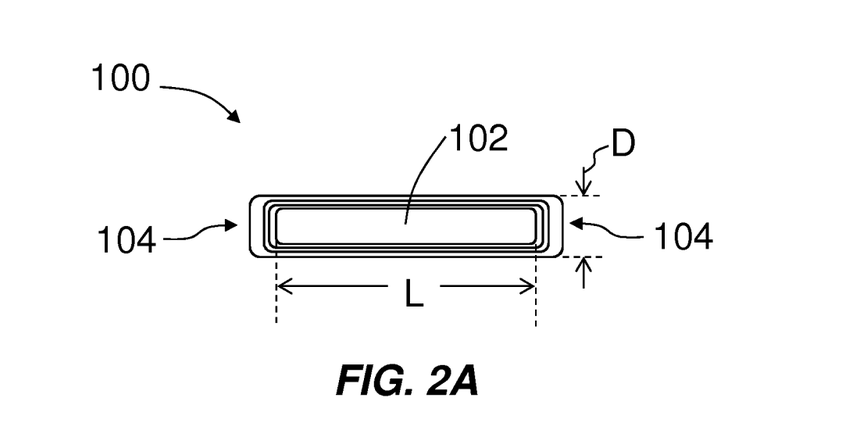
FIG. 2A is a schematic intensity contour representation of an example annealing laser beam.
Figure 2B:
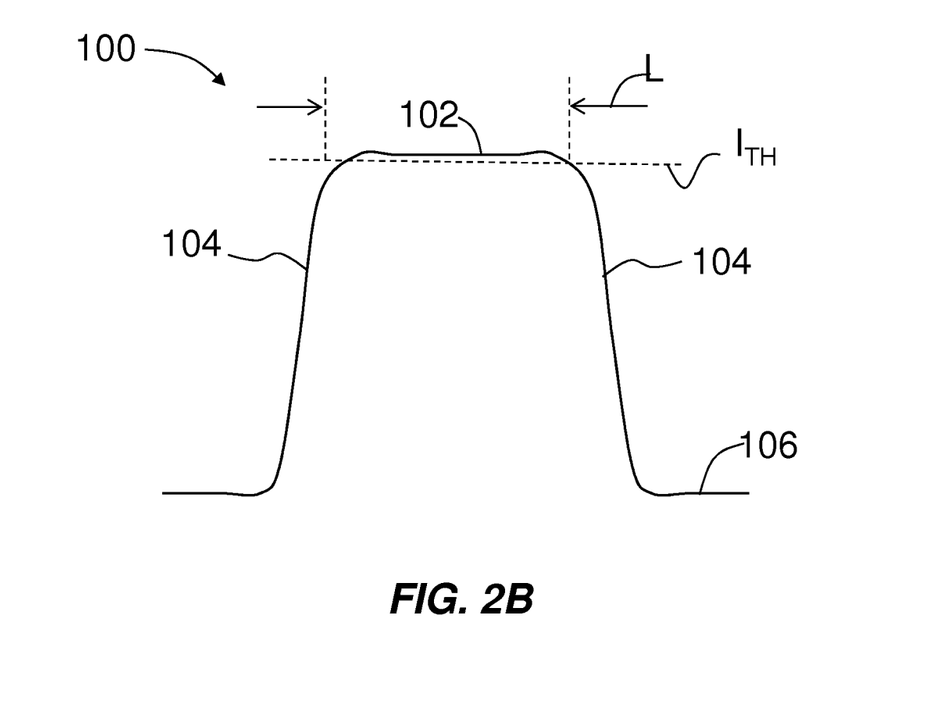
FIG. 2B is a cross-section of the schematic intensity contour representation of FIG. 2A as taken along the long direction, and showing the center section and tail sections of the annealing laser beam.

FIG. 2A is a schematic intensity contour representation of annealing laser beam 100, while FIG. 2B is a cross-sectional slice of the contour representation as taken in the long direction of the annealing laser beam. The annealing laser beam 100 forms a line image on wafer surface 12, so that the term "annealing laser beam" as used herein also means "line image" as formed on the wafer surface.

Annealing laser beam 100 includes a center section 102 where the intensity of the beam is substantially uniform and opposite tail sections ("tails") 104 where the intensity transitions smoothly and steeply (but not as a step-function) from the maximum value in the center section to a minimum intensity 106, which represents substantially zero intensity. Thus, the tails 104 have substantially reduced intensity as compared to central section 102.

Center section 102 can be defined by an intensity threshold $I_{TH}$ and defines a length L of annealing laser beam 100. A typical aspect ratio of the length L to the width D of annealing laser beam 100 is in the range from 10:1 to 1000:1.

Figure 3:
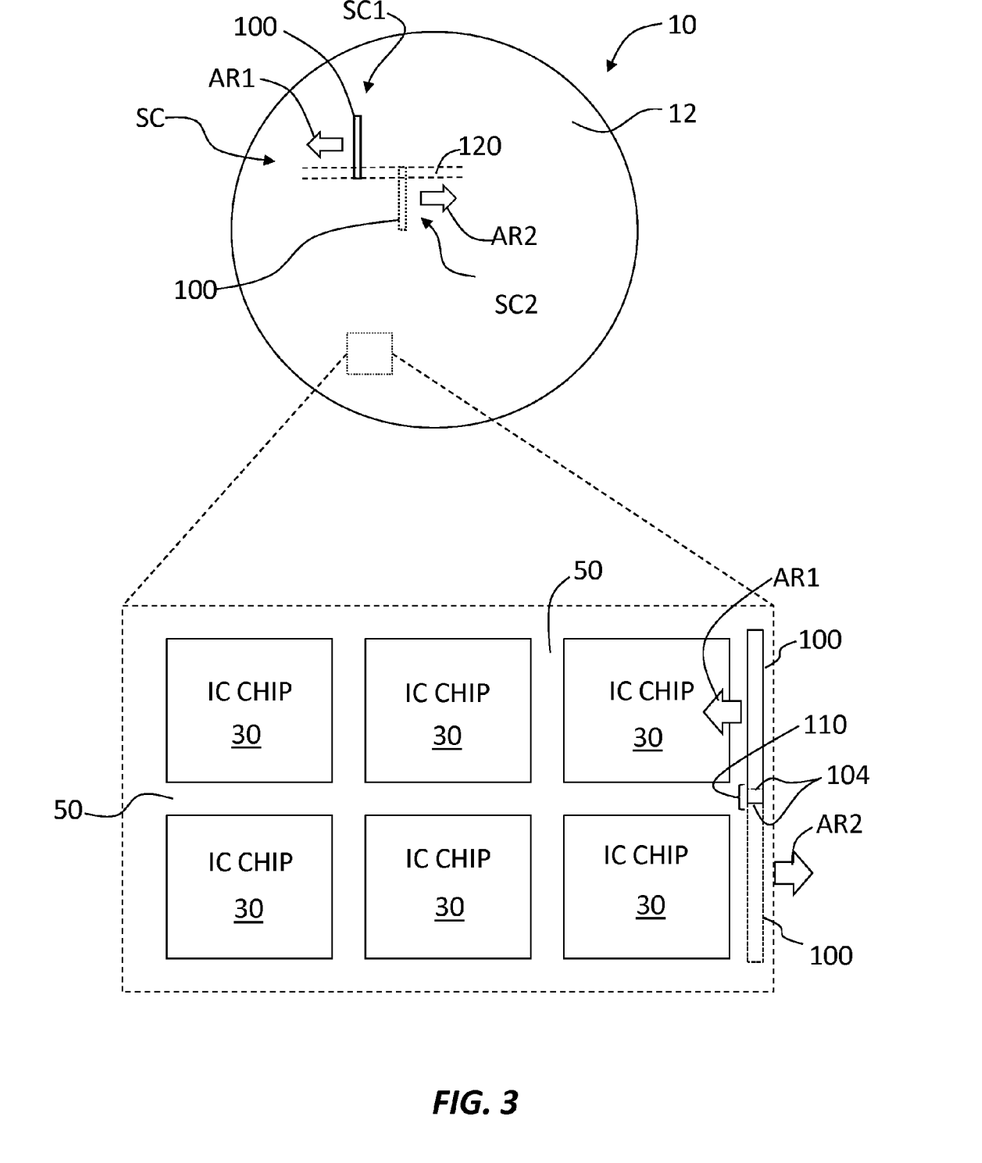
FIG. 3 is a plan view of the wafer that shows the annealing laser beam being scanned over IC chips over two adjacent scan path segments.

FIG. 3 is a plan view of wafer 10 that shows annealing laser beam 100 being scanned over IC chips 30 over two adjacent scan path segments SC1 and SC2 of an example scan path SC, with the direction of the scan paths segments respectively indicated by arrows AR1 and AR2. The scanning of annealing laser beam 100 is carried out such that the tails 104 of the annealing laser beam reside in a "tail region" 120 of wafer 10, as indicated by the horizontal dashed lines that correspond to the tails of annealing laser beam for adjacent scan path segments SC1 and SC2. In an example, tails 104 of adjacent scan path segments SC1 and SC2 of annealing laser beam 100 overlap in tail region 120. The inset of FIG. 3 shows how the tail region 120 is located in a horizontal scribe line 50 that separates adjacent IC chips 30. The overlap of tails 104 is indicated by 110.

Figure 4:
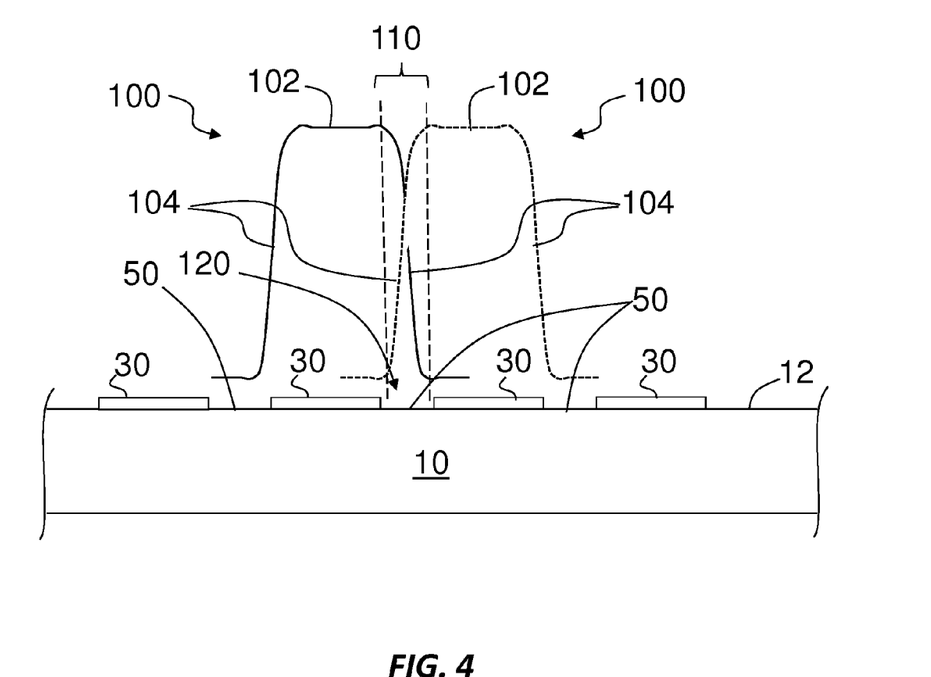
FIG. 4 is a cross-sectional view of the wafer showing the annealing laser beam as an intensity profile, with the overlapping tails of the adjacent scan path segments overlapping within the scribe line.

FIG. 4 is a cross-sectional view of wafer 10 and shows the annealing laser beam 100 as an intensity profile, with the overlapping tails 104 of adjacent scan path segments SC1 and SC2 (solid line and dashed line annealing laser beams, respectively) having an overlap 110 in tail region 120 that resides within scribe line 50. The process is repeated over the wafer for n scan paths, where all of the tail regions 120 associated with the n scan paths are located substantially within a corresponding scribe line 50.

Tail region 120 and tail overlap 110 represents an example of the stitching of adjacent scan path segments SC1 and SC2 of the scan path SC for annealing laser beam 100. Ensuring that tail region 120 falls within scribe lines 50 is accomplished by making the length L of annealing laser beam 100 match either the width $WD_{30}$ of IC chips 30 or the width $WD_{20}$ of dies 20. Examples of setting the length L based on the layout of the IC chips 30, dies 20 and scribe lines 50 on wafer 10 are discussed below.

While scribe lines 50 are sometimes populated with test devices (usually transistors), the performance of the IC chips 30 within dies 20 does not dependent upon the quality of the laser annealing within the scribe lines. This is true even though scribe lines 50 are sometimes populated with the aforementioned test devices 40.

Figure 5:
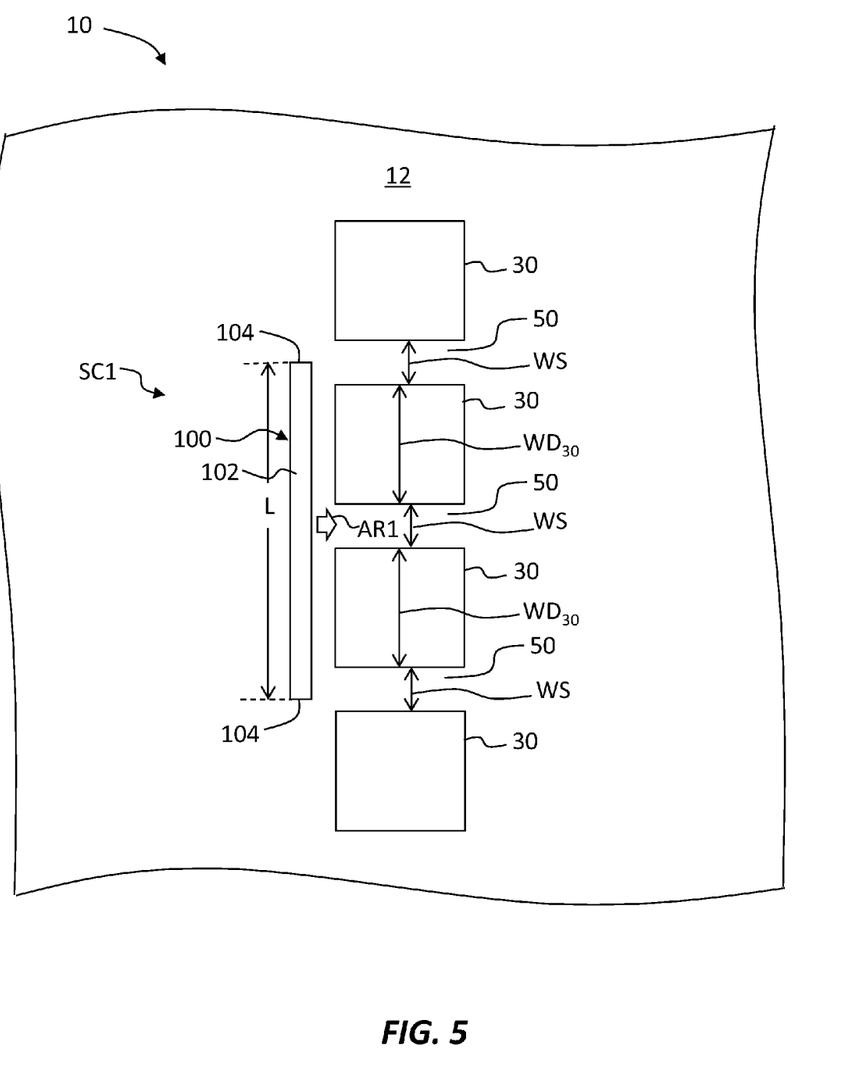
FIG. 5 is a close-up plan view of several IC chips on the surface of the wafer, along with an example annealing laser beam that simultaneously covers two IC chips, illustrating how the tails of the annealing laser beam fall with the scribe lines on respective sides of the IC chips.

FIG. 5 is a close-up plan view of several IC chips 30 on wafer surface 12, along with an example annealing laser beam 100. In an example, annealing laser beam 100 has a length L such that its tails 104 can be made to fall within scribe lines 50 and not within an IC chip 30 when the annealing laser beam is being scanned. Thus, to fit n IC chips 30 within the length L of annealing laser beam 100 as shown in FIG. 5 (where n is an integer 1, 2, 3 . . . ), the length L is defined by:

$$n \cdot WD_{30} + (n-1) \cdot WS < L < n \cdot WD_{30} + (n+1) \cdot WS. \quad \text{EQ. 1}$$

A similar relationship holds to fit n dies 20 within length L, namely:

$$n \cdot WD_{20} + (n-1) \cdot WS < L < n \cdot WD_{20} + (n+1) \cdot WS, \quad \text{EQ. 2}$$

where the scribe lines 50 of width WS are those separating adjacent dies 20.

It is noted that the general relationship for L as defined in terms of device structures 16 of width WD is:

$$n \cdot WD + (n-1) \cdot WS < L < n \cdot WD + (n+1) \cdot WS \quad \text{EQ. 3}$$

Figure 6:
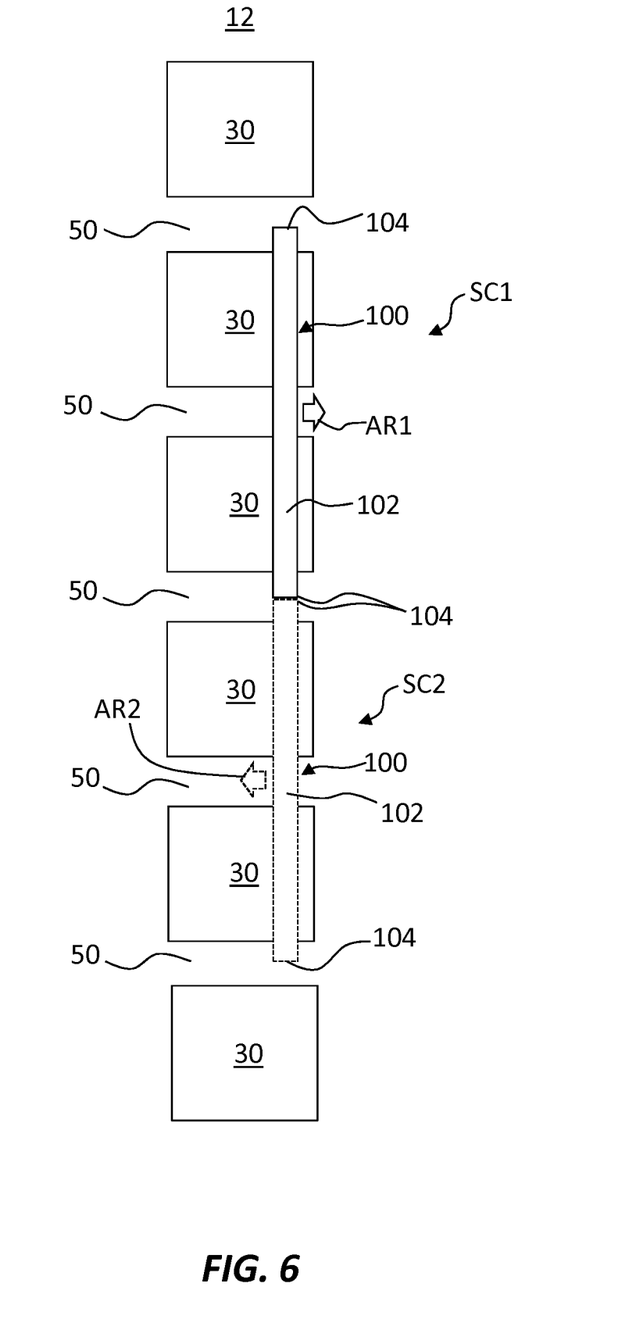
FIG. 6 is similar to FIG. 5 and shows the annealing laser beam of FIG. 5 for two adjacent scan path segments, and illustrates an example of a length of the annealing laser beam being selected such that the tails just touch within the scribe line.

FIG. 6 illustrates an example embodiment where annealing laser beam 100 has a length L such that it can simultaneously cover (scan) two IC chips 30 (i.e., n=2). In FIG. 6, the length $L \approx 2 \cdot (WD_{30} + WS)$ so that the tails 104 reside about in the middle of scribe lines 50.

Thus, an aspect of the disclosure includes selecting the length L of annealing laser beam 100 to have a length L as defined by one of the above equations so that the tails of annealing laser beam fall within scribe lines 50 adjacent the top and bottom of the device structures 16 being scanned. Note that in the embodiment shown in FIG. 6, the tails 104 of annealing laser beam just touch within scribe line 50. This condition is not possible when tails 104 do not fall within scribe lines 50 because it would result in non-uniform annealing of device structures 16 (which in FIG. 6 and FIG. 6 are IC chips 30).

Figure 7:
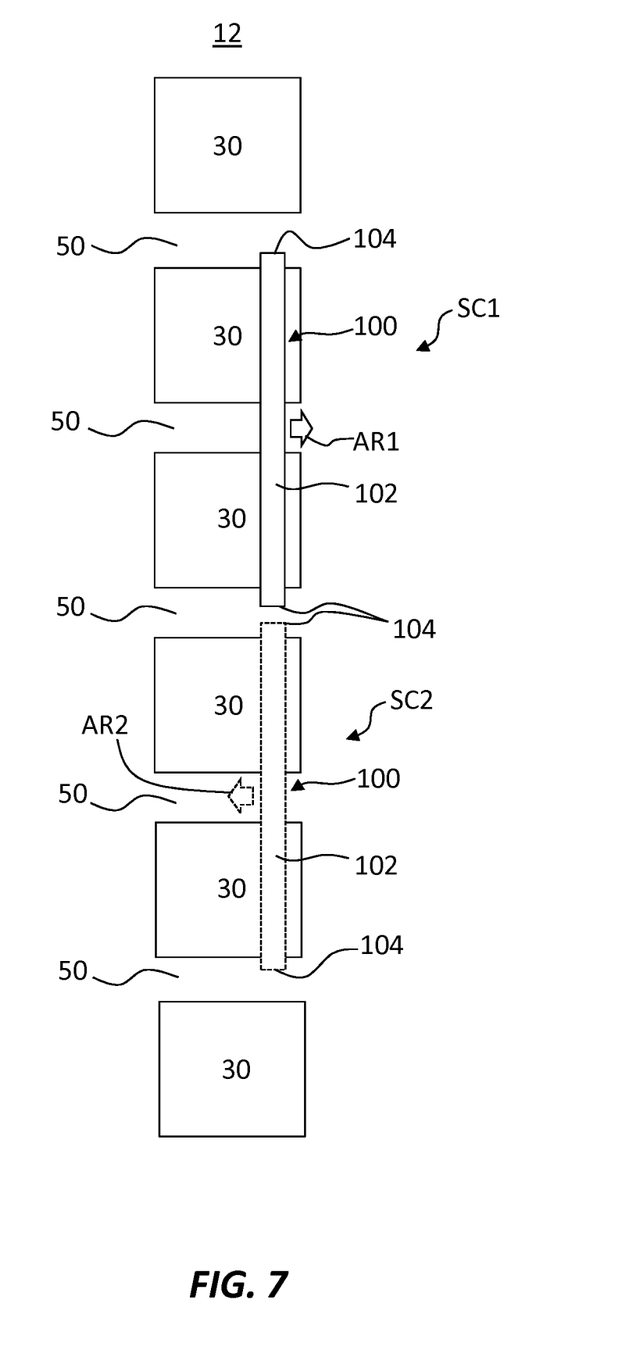
FIG. 7 is similar to FIG. 6 and shows the annealing laser beam having a length L selected such that the tails of the annealing laser beam for adjacent scan path segments fall within the scribe line but do not overlap within the scribe line.

FIG. 7 is similar to FIG. 6 and shows an example where the length $L \approx 2 \cdot WD_{30} + WS$, so that the tails extend about ¼ of the way into the respective scribe lines 50, so that the tails associated with adjacent scan path segments SC1 and SC2 do not overlap within the associated scribe lines. Thus, FIGS. 6 and 7 illustrate examples wherein the stitching of the adjacent scan path segments SC1 and SC2 of annealing laser beam 100 can involve no overlap of the tails 104 as long as the tails reside within a scribe line 50. This condition is not possible when tails 104 do not fall within scribe lines 50 because it would result in non-uniform annealing of the device structures 16 being scanned.

The examples of FIGS. 6 and 7 apply to both dies 20 and IC chips 30, and are described in connection with the IC chips by way of illustration.

The laser annealing methods disclosed herein can be used with both single-beam laser annealing systems and multiple-beam laser annealing systems. Either one or both of the laser beams of such systems can be adjusted to match the width of a single (or multiple) chips, as well as a single (or multiple) die according to equations EQ 1, EQ 2 or EQ 3, above.

Adjusting the length L of annealing laser beam 100 as described above and arranging the scan path SC so that tails 104 of the beam reside in corresponding scribe lines 50 can be used to reduce the global temperature non-uniformity of the laser annealing as measured on functioning device structures 16, e.g., IC chips 30. The intensity non-uniformity of annealing laser beam 100 (which relates to the temperature non-uniformity of the annealing process) is limited to scribe lines 50, where temperature non-uniformity in the annealing process is not critical. In some example embodiments of the present disclosure, the stitching of annealing laser beam 100 for adjacent scan path segments SC1 and SC2 need not involve overlap of the annealing laser beam tails 104 since the resulting non-uniformity is localized to scribe lines 50.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:

1. A method of annealing semiconductor device structures supported by a semiconductor wafer, comprising:

providing the semiconductor wafer having a wafer surface, with the semiconductor device structures having a cross-scan width WD and spaced apart by scribe lines having a cross-scan width WS:
defining a length L of an annealing laser beam that satisfies the relationship n·WD+(n−1)·WS<L<n·WD+(n+1)·WS for integer n, the annealing laser beam having a central section of substantially uniform intensity and opposite tails of substantially reduced intensity as compared to the central section; and
scanning the annealing laser beam over the semiconductor device structures over a scan path having adjacent scan path segments such that the center section simultaneously passes over at least n semiconductor devices while the tails of the annealing laser beam associated with the adjacent scan path segments reside only within the scribe lines.

2. The method according to claim 1, wherein the length L is selected such that the tails of the annealing laser beam associated with the adjacent scan path segments overlap within the scribe lines.

3. The method according to claim 1, wherein the length L is selected such that the tails of the annealing laser beam associated with the adjacent scan path segments reside within the scribe lines but do not overlap within the scribe lines.

4. The method according to claim 1, wherein the semiconductor device structures comprise dies and the scribe lines reside between the dies.

5. The method according to claim 1, wherein the semiconductor device structures comprise dies that in turn include integrated circuit (IC) chips, and wherein the scribe lines reside between the IC chips and between the dies.

6. A method of laser annealing semiconductor device structures supported by a semiconductor wafer, comprising:

providing the semiconductor wafer such that the semiconductor device structures are spaced apart by scribe lines;
defining an annealing laser beam having a central section of substantially uniform intensity and opposite tails of substantially reduced intensity as compared to the central section;
scanning a laser beam over the semiconductor wafer and the semiconductor device structures such that the central section simultaneously covers the entirety of one or more semiconductor device structures while the tails reside entirely within the scribe lines.

7. The method according to claim 6, further comprising performing the scanning over a scan path having adjacent scan path segments, and wherein the tails of the annealing laser beam associated with the adjacent scan path segments overlap within the scribe lines.

8. The method according to claim 6, further comprising performing the scanning over a scan path having adjacent scan path segments, and wherein the tails of the annealing laser beam associated with the adjacent scan path segments do not overlap within the scribe lines.

9. The method according to claim 6, wherein the scribe lines have a cross-scan width in the range from 50 microns to 75 microns.

10. The method according to claim 6, wherein the semiconductor device structures have a cross-scan width WD, the scribe lines have a cross-scan width WS, and wherein the annealing laser beam has a length L that satisfies the relationship for integer n:

$$n \cdot WD + (n-1) \cdot WS < L < n \cdot WD + (n+1) \cdot WS.$$

\* \* \* \* \*